(12) United States Patent
Hamaguchi

(10) Patent No.: US 6,950,138 B2
(45) Date of Patent: Sep. 27, 2005

(54) GRAY CODE COUNTER

(75) Inventor: Mutsumi Hamaguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 669 days.

(21) Appl. No.: 10/058,386

(22) Filed: Jan. 30, 2002

(65) Prior Publication Data

US 2002/0101526 A1 Aug. 1, 2002

(30) Foreign Application Priority Data

Jan. 30, 2001 (JP) ........................................ 2001-021051

(51) Int. Cl.[7] .............................................. H04N 3/14
(52) U.S. Cl. ..................... 348/312; 348/305; 348/320; 377/34; 341/97; 341/98
(58) Field of Search ............................. 348/222.1, 272, 348/294, 302, 305, 307, 311, 312, 317, 320, 324; 250/208.1; 377/34, 33, 44, 45, 52, 53; 341/97, 98

(56) References Cited

U.S. PATENT DOCUMENTS

| 3,924,614 | A | * | 12/1975 | Segal ............................ 377/27 |
| 5,084,841 | A | * | 1/1992 | Williams et al. ....... 365/189.07 |
| 5,191,425 | A | * | 3/1993 | Hachiyama et al. ...... 348/222.1 |
| 5,754,614 | A | * | 5/1998 | Wingen ......................... 377/34 |
| 6,314,154 | B1 | * | 11/2001 | Pontius ........................ 377/16 |
| 6,762,701 | B2 | * | 7/2004 | Jiang ............................ 341/98 |

FOREIGN PATENT DOCUMENTS

| DE | 0 456 193 B1 | 1/1999 |
| JP | 1-296712 | 11/1989 |

* cited by examiner

Primary Examiner—James J. Groody
Assistant Examiner—Brian Jelinek
(74) Attorney, Agent, or Firm—Birch, Stewart, Kolasch & Birch, LLP

(57) ABSTRACT

Conventionally, it is difficult to design the logic of a Gray code counter that can be used in interlaced counting. Even though interlaced counting is possible with a Gray code counter, the number of simultaneously changing bits increases greatly depending on the number of counts skipped at a time. To overcome these problems, a Gray code counter according to the present invention has a consecutively counting Gray code counter that counts in increments or decrements of one, and an output value converter circuit that converts the Gray code data output from the consecutively counting Gray code counter into a Gray code corresponding to decimal counts as obtained by counting with (2 raised to a particular power minus 1) counts skipped at a time.

16 Claims, 19 Drawing Sheets

PRIOR ART
Fig. 2

| DECIMAL COUNT | BINARY CODE | GRAY CODE |
|---|---|---|
| 0 | 00000 | 00000 |
| 1 | 00001 | 00001 |
| 2 | 00010 | 00011 |
| 3 | 00011 | 00010 |
| 4 | 00100 | 00110 |
| 5 | 00101 | 00111 |
| 6 | 00110 | 00101 |
| 7 | 00111 | 00100 |
| 8 | 01000 | 01100 |
| 9 | 01001 | 01101 |
| 10 | 01010 | 01111 |
| 11 | 01011 | 01110 |
| 12 | 01100 | 01010 |
| 13 | 01101 | 01011 |
| 14 | 01110 | 01001 |
| 15 | 01111 | 01000 |
| 16 | 10000 | 11000 |
| 17 | 10001 | 11001 |
| 18 | 10010 | 11011 |
| 19 | 10011 | 11010 |
| 20 | 10100 | 11110 |
| 21 | 10101 | 11111 |
| 22 | 10110 | 11101 |
| 23 | 10111 | 11100 |
| 24 | 11000 | 10100 |
| 25 | 11001 | 10101 |
| 26 | 11010 | 10111 |
| 27 | 11011 | 10110 |
| 28 | 11100 | 10010 |
| 29 | 11101 | 10011 |
| 30 | 11110 | 10001 |
| 31 | 11111 | 10000 |

Fig. 3

| DECIMAL COUNT | GRAY CODE | GRAY CODE HIGHEST 4 BITS | GRAY CODE LOWEST BIT |
|---|---|---|---|
| 0 | 00000 | 0000 | 0 |
| 2 | 00011 | 0001 | 1 |
| 4 | 00110 | 0011 | 0 |
| 6 | 00101 | 0010 | 1 |
| 8 | 01100 | 0110 | 0 |
| 10 | 01111 | 0111 | 1 |
| 12 | 01010 | 0101 | 0 |
| 14 | 01001 | 0100 | 1 |
| 16 | 11000 | 1100 | 0 |
| 18 | 11011 | 1101 | 1 |
| 20 | 11110 | 1111 | 0 |
| 22 | 11101 | 1110 | 1 |
| 24 | 10100 | 1010 | 0 |
| 26 | 10111 | 1011 | 1 |
| 28 | 10010 | 1001 | 0 |
| 30 | 10001 | 1000 | 1 |

Fig. 4

| DECIMAL COUNT | GRAY CODE | GRAY CODE HIGHEST 3 BITS | GRAY CODE FIRST BITS | GRAY CODE LOWEST BIT |
|---|---|---|---|---|
| 0 | 00000 | 000 | 0 | 0 |
| 4 | 00110 | 001 | 1 | 0 |
| 8 | 01100 | 011 | 0 | 0 |
| 12 | 01010 | 010 | 1 | 0 |
| 16 | 11000 | 110 | 0 | 0 |
| 20 | 11110 | 111 | 1 | 0 |
| 24 | 10100 | 101 | 0 | 0 |
| 28 | 10010 | 100 | 1 | 0 |

Fig. 5

| DECIMAL COUNT | GRAY CODE | GRAY CODE HIGHEST 2 BITS | GRAY CODE SECOND BITS | GRAY CODE FIRST BITS | GRAY CODE LOWEST BIT |
|---|---|---|---|---|---|
| 0 | 00000 | 00 | 0 | 0 | 0 |
| 8 | 01100 | 01 | 1 | 0 | 0 |
| 16 | 11000 | 11 | 0 | 0 | 0 |
| 24 | 10100 | 10 | 1 | 0 | 0 |

Fig. 7

| CONTROL SIGNALS | | OUTPUT BIT DATA | | | | | COUNT OPERATION |
|---|---|---|---|---|---|---|---|
| mode1 | mode0 | Q4 | Q3 | Q2 | Q1 | Q0 | |
| 0 | 0 | Q4p | Q3p | Q2p | Q1p | Q0p | CONSECUTIVE |
| 0 | 1 | Q3p | Q2p | Q1p | Q0p | tog | 1 COUNT SKIPPED |
| 1 | 0 | Q2p | Q1p | Q0p | tog | 0 | 3 COUNTS SKIPPED |
| 1 | 1 | Q1p | Q0p | tog | 0 | 0 | 7 COUNTS SKIPPED |

Fig. 17A

| DECIMAL COUNT | GRAY CODE | GRAY CODE HIGHEST 4 BITS | GRAY CODE LOWEST BIT |
|---|---|---|---|
| 0 | 00000 | 0000 | 0 |
| 2 | 00011 | 0001 | 1 |
| 4 | 00110 | 0011 | 0 |
| 6 | 00101 | 0010 | 1 |
| 8 | 01100 | 0110 | 0 |
| 10 | 01111 | 0111 | 1 |
| 12 | 01010 | 0101 | 0 |
| 14 | 01001 | 0100 | 1 |
| 16 | 11000 | 1100 | 0 |
| 18 | 11011 | 1101 | 1 |
| 20 | 11110 | 1111 | 0 |
| 22 | 11101 | 1110 | 1 |
| 24 | 10100 | 1010 | 0 |
| 26 | 10111 | 1011 | 1 |
| 28 | 10010 | 1001 | 0 |
| 30 | 10001 | 1000 | 1 |

Fig. 17B

| DECIMAL COUNT | GRAY CODE | GRAY CODE HIGHEST 4 BITS | GRAY CODE LOWEST BIT |
|---|---|---|---|
| 1 | 00001 | 0000 | 1 |
| 3 | 00010 | 0001 | 0 |
| 5 | 00111 | 0011 | 1 |
| 7 | 00100 | 0010 | 0 |
| 9 | 01101 | 0110 | 1 |
| 11 | 01110 | 0111 | 0 |
| 13 | 01011 | 0101 | 1 |
| 15 | 01000 | 0100 | 0 |
| 17 | 11001 | 1100 | 1 |
| 19 | 11010 | 1101 | 0 |
| 21 | 11111 | 1111 | 1 |
| 23 | 11100 | 1110 | 0 |
| 25 | 10101 | 1010 | 1 |
| 27 | 10110 | 1011 | 0 |
| 29 | 10011 | 1001 | 1 |
| 31 | 10000 | 1000 | 0 |

Fig. 18A

| DECIMAL COUNT | GRAY CODE | GRAY CODE HIGHEST 3 BITS | GRAY CODE FIRST BIT | GRAY CODE LOWEST BIT |
|---|---|---|---|---|
| 0 | 00000 | 000 | 0 | 0 |
| 4 | 00110 | 001 | 1 | 0 |
| 8 | 01100 | 011 | 0 | 0 |
| 12 | 01010 | 010 | 1 | 0 |
| 16 | 11000 | 110 | 0 | 0 |
| 20 | 11110 | 111 | 1 | 0 |
| 24 | 10100 | 101 | 0 | 0 |
| 28 | 10010 | 100 | 1 | 0 |

Fig. 18B

| DECIMAL COUNT | GRAY CODE | GRAY CODE HIGHEST 3 BITS | GRAY CODE FIRST BIT | GRAY CODE LOWEST BIT |
|---|---|---|---|---|
| 1 | 00001 | 000 | 0 | 1 |
| 5 | 00111 | 001 | 1 | 1 |
| 9 | 01101 | 011 | 0 | 1 |
| 13 | 01011 | 010 | 1 | 1 |
| 17 | 11001 | 110 | 0 | 1 |
| 21 | 11111 | 111 | 1 | 1 |
| 25 | 10101 | 101 | 0 | 1 |
| 29 | 10011 | 100 | 1 | 1 |

Fig. 18C

| DECIMAL COUNT | GRAY CODE | GRAY CODE HIGHEST 3 BITS | GRAY CODE FIRST BIT | GRAY CODE LOWEST BIT |
|---|---|---|---|---|
| 2 | 00011 | 000 | 1 | 1 |
| 6 | 00101 | 001 | 0 | 1 |
| 10 | 01111 | 011 | 1 | 1 |
| 14 | 01001 | 010 | 0 | 1 |
| 18 | 11011 | 110 | 1 | 1 |
| 22 | 11101 | 111 | 0 | 1 |
| 26 | 10111 | 101 | 1 | 1 |
| 30 | 10001 | 100 | 0 | 1 |

Fig. 18D

| DECIMAL COUNT | GRAY CODE | GRAY CODE HIGHEST 3 BITS | GRAY CODE FIRST BIT | GRAY CODE LOWEST BIT |
|---|---|---|---|---|
| 3 | 00010 | 000 | 1 | 0 |
| 7 | 00100 | 001 | 0 | 0 |
| 11 | 01110 | 011 | 1 | 0 |
| 15 | 01000 | 010 | 0 | 0 |
| 19 | 11010 | 110 | 1 | 0 |
| 23 | 11100 | 111 | 0 | 0 |
| 27 | 10110 | 101 | 1 | 0 |
| 31 | 10000 | 100 | 0 | 0 |

Fig. 19

| CONTROL SIGNALS | | OUTPUT BIT DATA | | | | | COUNT OPERATION |
|---|---|---|---|---|---|---|---|
| mode1 | mode0 | Q4 | Q3 | Q2 | Q1 | Q0 | |
| 0 | 0 | Q4p | Q3p | Q2p | Q1p | Q0p | CONSECUTIVE |
| 0 | 1 | Q3p | Q2p | Q1p | Q0p | tog | 1 COUNT SKIPPED |
| 1 | 0 | Q2p | Q1p | Q0p | tog | START0 | 3 COUNTS SKIPPED |
| 1 | 1 | Q1p | Q0p | tog | START1 | START0 | 7 COUNTS SKIPPED |

Fig. 20

| CONTROL SIGNALS | | INPUT VALUE CONVERTER OUTPUT BIT DATA | | | | | COUNT OPERATION |
|---|---|---|---|---|---|---|---|
| mode1 | mode0 | AFT_START4 | AFT_START3 | AFT_START2 | AFT_START1 | AFT_START0 | |
| 0 | 0 | START4 | START3 | START2 | START1 | START0 | CONSECUTIVE |
| 0 | 1 | 0 | START4 | START3 | START2 | START1 | 1 COUNT SKIPPED |
| 1 | 0 | 0 | 0 | START4 | START3 | START2 | 3 COUNTS SKIPPED |
| 1 | 1 | 0 | 0 | 0 | START4 | START3 | 7 COUNTS SKIPPED |

GRAY CODE COUNTER

BACKGROUND OF THE INVENTION

1. Field of the Invention

The present invention relates to a Gray code counter.

2. Description of the Prior Art

Some solid-state image sensors adopt a scanning circuit of a decoder type. A decoder-type scanning circuit is provided with a counter, and scans the address that coincides with the value output from the counter. By making this counter perform the desired counting operation, it is possible to achieve image sensing.

Conventionally, such a decoder-type scanning circuit employs a binary counter. However, in a binary counter, an increment or decrement by one of its decimal count sometimes causes simultaneous change in a plurality of bits. For example, in a 5-bit binary counter, when its decimal count changes from "0" to "1," as FIG. 2 shows, the binary code changes from (00000) to (00001), causing change only in one bit. By contrast, when the decimal count changes from "15" to "16," as FIG. 2 shows, the binary code changes from (01111) to (10000), causing change in five bits simultaneously. The greater the number of bits in which such change takes place simultaneously, the more power current flows through the system in which the counter is provided, causing electric noise. This may lead to interference between signals within the system, and thus to malfunctioning of the system.

To reduce such electric noise, it is customary to use a Gray code counter. FIG. 22 shows a typical circuit configuration of a 5-bit Gray code counter.

The Q output terminal of a flip-flop FF6 is connected through a buffer BUF1 to the C input terminal of a flip-flop FF1. The XQ output terminal of the flip-flop FF6 is connected to the first input terminal of each of NAND circuits NA1 to NA4.

The second input terminal of the NAND circuit NA1 is connected to the Q output terminal of the flip-flop FF1. The output terminal of the NAND circuit NA1 is connected through an inverter circuit INV1 to the C input terminal of a flip-flop FF2.

The second input terminal of the NAND circuit NA2 is connected to the XQ output terminal of the flip-flop FF1, and the third input terminal of the NAND circuit NA2 is connected to the Q output terminal of the flip-flop FF2. The output terminal of the NAND circuit NA2 is connected through an inverter circuit INV2 to the C input terminal of a flip-flop FF3.

The second input terminal of the NAND circuit NA3 is connected to the XQ output terminal of the flip-flop FF1, the third input terminal of the NAND circuit NA3 is connected to the XQ output terminal of the flip-flop FF2, and the fourth input terminal of the NAND circuit NA3 is connected to the Q output terminal of the flip-flop FF3. The output terminal of the NAND circuit NA3 is connected through an inverter circuit INV3 to the C input terminal of a flip-flop FF4.

The second input terminal of the NAND circuit NA4 is connected to the XQ output terminal of the flip-flop FF1, the third input terminal of the NAND circuit NA4 is connected to the XQ output terminal of the flip-flop FF2, the fourth input terminal of the NAND circuit NA4 is connected to the XQ output terminal of the flip-flop FF3, and the fifth input terminal of the NAND circuit NA4 is connected to the Q output terminal of the flip-flop FF4. The output terminal of the NAND circuit NA4 is connected through an inverter circuit INV4 to the C input terminal of a flip-flop FF5.

Moreover, in each of the flip-flops FF1 to FF6, the XQ output terminal and the D input terminal are connected together. Thus, in each of the flip-flops FF1 to FF6, every time the clock signal fed to their C input terminal rises, the output signal output from their Q output terminal is inverted.

The buffer BUF1, the NAND circuits NA1 to NA4, and the inverter circuits INV1 to INV4 together constitute a clock generating circuit 21, which functions as a circuit that generates clocks that determine the timing with which the individual outputs of the Gray code counter 2 are inverted.

Next, the operation of this Gray code counter 2 will be described with reference to FIGS. 22 and 23. Here, it is assumed that the set signals SETQ0 to SETQ4 and SETNCK fed respectively to the XS terminals of the flip-flops FF1 to FF6 are kept at "1" all the time, and that the reset signals RESETQ0 to RESETQ4 and RESETNCK fed respectively to the XR terminals of the flip-flops FF1 to FF6 are initially set at "0" and are then turned to "1."

The flip-flop FF6 receives a reference clock signal CK, produces a ½ clock signal NCK by dividing the reference clock signal CK by a factor of 2, and feeds the ½ clock signal NCK and the inverted version NCKX thereof to the clock generating circuit 21 in the following stage.

The clock generating circuit 21 produces a clock signal Q0CKN that is identical with the ½ clock signal NCK. The flip-flop FF1 receives the clock signal Q0CKN from the clock generating circuit 21, and therefore outputs an output signal Q0$p$ that is inverted every time the ½ clock signal NCK rises and the inverted version Q0X of that output signal Q0$p$.

The clock generating circuit 21 also produces a clock signal Q1CKN that rises when the ½ clock signal NCK falls while the output signal Q0$p$ is at "1." The flip-flop FF2 receives the clock signal Q1CKN from the clock generating circuit 21, and therefore outputs an output signal Q1$p$ that is inverted every time the clock signal Q1CKN rises and the inverted version Q1X of that output signal Q1$p$.

The clock generating circuit 21 also produces a clock signal Q2CKN that rises when the ½ clock signal NCK falls while the output signal Q0$p$ is at "0" and the output signal Q1$p$ is at "1." The flip-flop FF3 receives the clock signal Q2CKN from the clock generating circuit 21, and therefore outputs an output signal Q2$p$ that is inverted every time the clock signal Q2CKN rises and the inverted version Q2X of that output signal Q2$p$.

The clock generating circuit 21 also produces a clock signal Q3CKN that rises when the ½ clock signal NCK falls while the output signal Q0$p$ is at "0," the output signal Q1$p$ is at "0," and the output signal Q2$p$ is at "1." The flip-flop FF4 receives the clock signal Q3CKN from the clock generating circuit 21, and therefore outputs an output signal Q3$p$ that is inverted every time the clock signal Q3CKN rises and the inverted version Q3X of that output signal Q3$p$.

The clock generating circuit 21 also produces a clock signal Q4CKN that rises when the ½ clock signal NCK falls while the output signal Q0$p$ is at "0," the output signal Q1$p$ is at "0," the output signal Q2$p$ is at "0," and the output signal Q3$p$ is at "1." The flip-flop FF5 receives the clock signal Q4CKN from the clock generating circuit 21, and therefore outputs an output signal Q4$p$ that is inverted every time the clock signal Q4CKN rises and the inverted version Q4X of that output signal Q4$p$.

If it is assumed that the output signal Q0$p$ is the output for the zeroth bit, i.e. the lowest bit, the output signal Q1$p$ is the output for the first bit, the output signal Q2p is the output for the second bit, the output signal Q3p is the output for the third bit, and the output signal Q4p is the output for the fourth bit, i.e. the highest bit, then the Gray code counter 2 outputs the Gray code shown in FIG. 2 according to the decimal count of the clock signal CK.

In a Gray code, any two consecutive decimal counts are represented by codewords that differ only in one bit and that are identical in the other bits. That is, between any two consecutive decimal counts, change takes place only in one bit. Accordingly, with a Gray code, change in bits is accompanied by less current, and thus less noise, than with a binary code.

On the other hand, in a solid-state image sensor, it is sometimes necessary to make a counter perform interlaced counting, i.e. to make a decoder-type scanning circuit perform interlaced scanning.

For example, by switching between interlaced scanning and ordinary (non-interlaced) scanning, it is possible to furnish a solid-state image sensor with an electronic zoom function. Specifically, for ordinary image sensing (without electronic zooming), interlaced scanning is performed, and, for image sensing using electronic zooming, ordinary scanning is performed. Now, how this is achieved will be described, taking up as an example a case in which are used a solid-state image sensor of which the image sensing area has 200 addresses (pixels) horizontally and 200 addresses (pixels) vertically and a display device of which the display area has 100 pixels horizontally and 100 pixels vertically.

In ordinary image sensing (without electronic zooming), the solid-state image sensor scans every second address, like 0, 2, 4, ..., 196, and 198, both horizontally and vertically, so that image data is acquired at 10,000 (100×100) pixels and an image based thereon is displayed on the display device. When electronic zooming is used, the solid-state image sensor scans every address, like 0, 1, 2, ..., 98, and 99, both horizontally and vertically, so that image data is acquired at 10,000 (100×100) pixels and an image based thereon is displayed on the display device. In this case, where electronic zooming is used, the image displayed is the fourfold magnified (zoomed in) version of the upper left-hand quarter of the image obtained in ordinary image sensing.

Moreover, in a solid-state image sensor, it is sometimes necessary to take both still and moving pictures. With a moving picture, it is often difficult to scan all the addresses because of restrictions associated with the processing frequency. By contrast, with a still picture, there are no such restrictions associated with the processing frequency, and therefore it is desirable to scan all the addresses to obtain the highest possible resolution. That is, it is advisable to scan all the addresses with a still picture and scan the addresses in an interlaced manner with a moving picture.

However, a Gray code is more difficult to handle in operation (in particular, addition) than a binary code, and the code itself is complex. This makes it difficult to design the logic of a Gray code counter that can be used in interlaced counting. For this reason, where interlaced counting as described above is necessary, it is customary to use a binary counter. Even though interlaced counting is possible with a Gray code counter, the number of simultaneously changing bits increases greatly depending on the number of counts skipped at a time when interlaced counting is performed. For example, in a case where interlaced counting is performed with 9 counts skipped at a time, when the count changes from "0" to "10," the Gray code changes from (00000) to (01111), with four bits changing simultaneously. This spoils the advantage of a Gray code of reducing the number of simultaneously changing bits.

Furthermore, in a solid-state image sensor, to permit a portion of the screen to be cut out, it is necessary to use a decoder-type scanning circuit that can scan from a specified address to a specified address, i.e. that permits random access. For example, in a solid-state image sensor having 200 addresses horizontally, by scanning only addresses 100 to 149, it is possible to cut out the image corresponding to addresses 100 to 149 without scanning the image corresponding to addresses 1 to 99 and 150 to 200. To achieve this, it is essential to use a counter that permits the counts at which to start and stop counting to be specified freely.

SUMMARY OF THE INVENTION

An object of the present invention is to provide a Gray code counter that permits interlaced counting and that achieves interlaced counting without causing change in more than two bits simultaneously. Another object of the present invention is to provide a solid-state image sensor that permits interlaced address scanning and that operates with reduced electric noise, and to provide a camera system employing such a solid-state image sensor.

To achieve the above objects, a Gray code counter according to the present invention is provided with: a consecutively counting Gray code counter that counts in increments or decrements of one; and an output value converter circuit that converts the Gray code data output from the consecutively counting Gray code counter into a Gray code corresponding to decimal counts as obtained by counting with (2 raised to a particular power minus 1) counts skipped at a time.

To achieve the above objects, a solid-state image sensor according to the present invention, and a camera system employing such a solid-state image sensor, is provided with a Gray code counter configured as described above.

BRIEF DESCRIPTION OF THE DRAWINGS

This and other objects and features of the present invention will become clear from the following description, taken in conjunction with the preferred embodiments with reference to the accompanying drawings in which:

FIG. 2 is a diagram showing decimal counts and the corresponding 5-bit binary and Gray codes;

FIG. 3 is a diagram showing decimal counts and the corresponding Gray code, in a case where counting is performed with one count skipped at a time;

FIG. 4 is a diagram showing decimal counts and the corresponding Gray code, in a case where counting is performed with three counts skipped at a time;

FIG. 5 is a diagram showing decimal counts and the corresponding Gray code, in a case where counting is performed with seven counts skipped at a time;

FIG. 7 is a diagram showing the relationship between the control signals and the output bits of the output value converter shown in FIG. 6;

FIG. 17A is a diagram showing decimal counts and the corresponding Gray code, in a case where counting is performed starting at "0" and with one count skipped at a time;

FIG. 17B is a diagram showing decimal counts and the corresponding Gray code, in a case where counting is performed starting at "1" and with one count skipped at a time;

FIG. 18A is a diagram showing decimal counts and the corresponding Gray code, in a case where counting is performed starting at "0" and with three counts skipped at a time;

FIG. 18B is a diagram showing decimal counts and the corresponding Gray code, in a case where counting is performed starting at "1" and with three counts skipped at a time;

FIG. 18C is a diagram showing decimal counts and the corresponding Gray code, in a case where counting is performed starting at "2" and with three counts skipped at a time;

FIG. 18D is a diagram showing decimal counts and the corresponding Gray code, in a case where counting is performed starting at "3" and with three counts skipped at a time;

FIG. 19 is a diagram showing the relationship between the control signals and the output bits of the output value converter shown in FIG. 15;

FIG. 20 is a diagram showing the relationship between the control signals and the output bits of the input value converter shown in FIG. 9;

DESCRIPTION OF THE PREFERRED EMBODIMENTS

Figure 1:
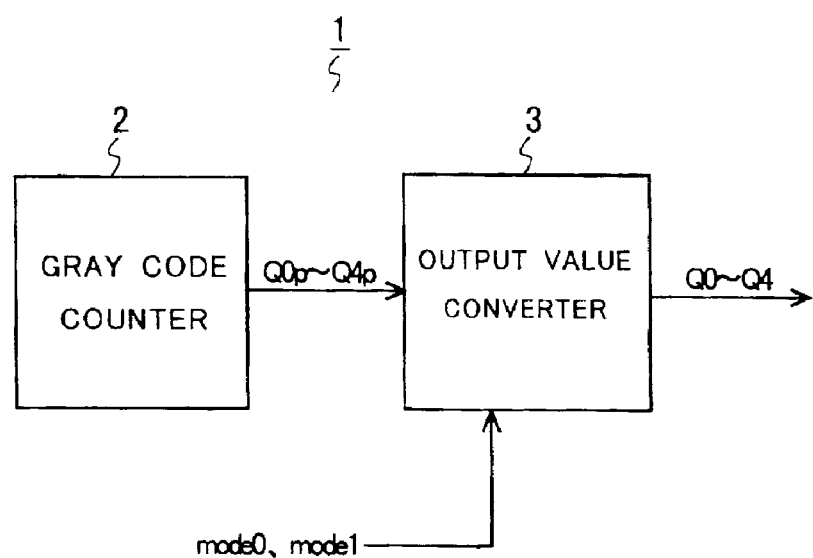
FIG. 1 is a configuration diagram of the Gray code counter of a first embodiment of the invention.
Figure 22:
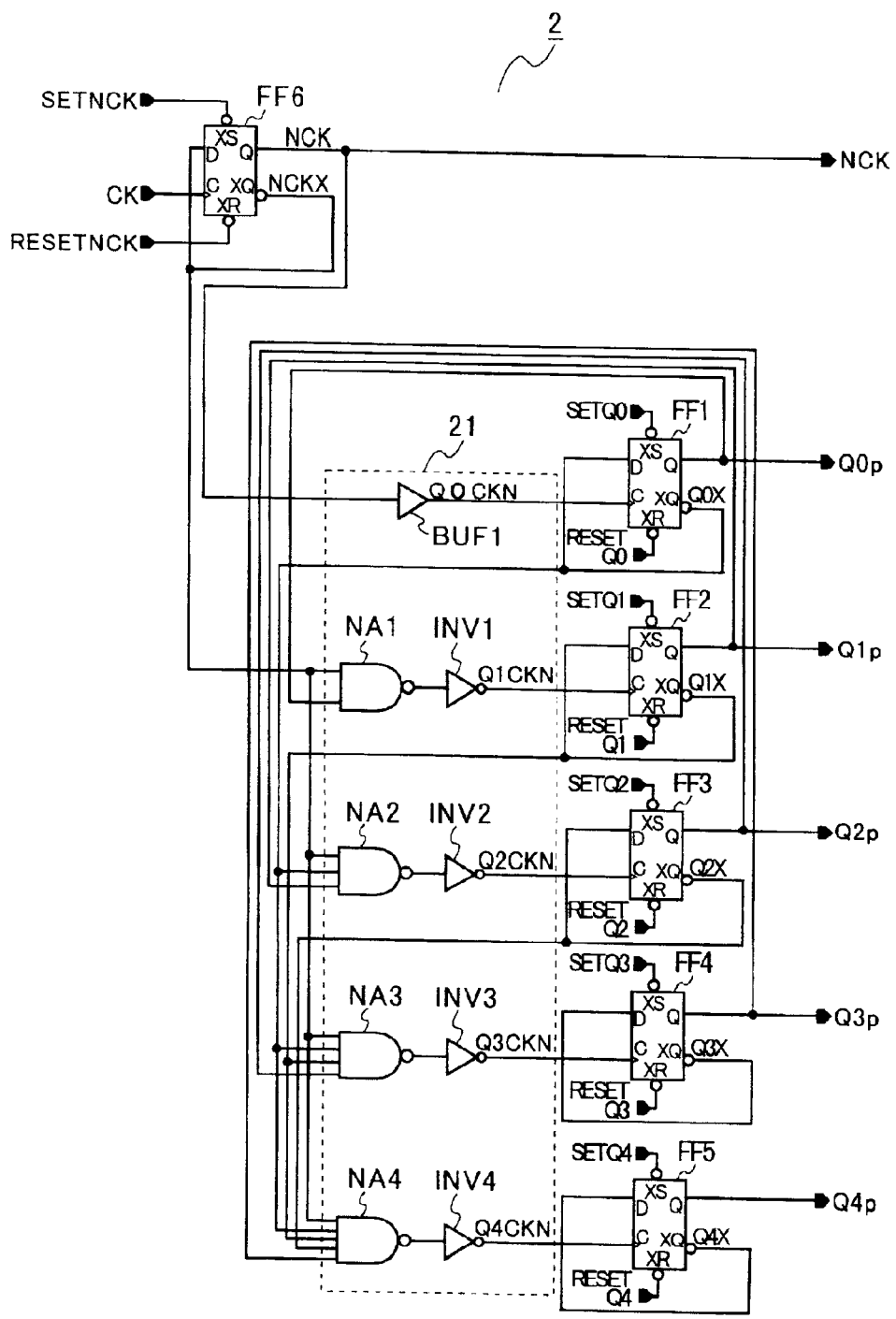
FIG. 22 is a logic circuit diagram of a consecutively counting Gray code counter.

Hereinafter, embodiments of the present invention will be described with reference to the drawings. FIG. 1 shows the configuration of the Gray code counter of a first embodiment of the invention. The Gray code counter of the first embodiment is of a 5-bit type, and incorporates a consecutively counting Gray code counter 2 that counts in increments or decrements of one, which has the same circuit configuration as the Gray code counter shown in FIG. 22. The Gray code counter 1 of the first embodiment is provided with, in addition to the consecutively counting Gray code counter 2, an output value converter 3.

The Gray code counter 2 outputs Gray code data Q0$p$ to Q4$p$. The output value converter 3, when the control signals mode0 and mode 1 fed thereto request consecutive counting (i.e. counting in increments or decrements of one), outputs the Gray code data Q0$p$ to Q4$p$ fed from the Gray code counter 2 intact as output data Q0 to Q4. However, the output value converter 3, when the control signals mode0 and mode 1 fed thereto request counting with $2^M-1$ counts skipped at a time, coverts the Gray code data Q0$p$ to Q4$p$ fed from the Gray code counter 2 into a Gray code that corresponds to a decimal count obtained by counting with $2^M-1$ counts skipped at a time, and then outputs the resulting data as output data Q0 to Q4.

Now, the relationship between the Gray code output data obtained by consecutive counting and the Gray code output data obtained by counting with $2^M-1$ counts skipped at a time will be considered. As will be clear from FIG. 2, the Gray code output data obtained by consecutive counting exhibits a bit change pattern in which the Kth bit is kept at "0" for the first $2^K$ counts and then inverted, and thereafter repeats being kept constant for $2^{K+1}$ counts and then inverted.

When counting is performed with $2^M-1$ counts skipped at a time and M=1, i.e. when counting is performed with one count skipped at a time, the Gray code counter 1 of the first embodiment counts in this way: 0, 2, 4, 6, . . . . FIG. 3 is a diagram showing decimal counts and the corresponding Gray code in a case where counting is performed with one count skipped at a time. As will be clear from the FIG. 3, in the Gray code obtained by counting with one count skipped at a time, the zeroth bit (the lowest bit) is inverted every time the count changes, and the way the ($\alpha$+1)th bit belonging to the highest four bits (the fourth to first bits) changes every time the count changes is the same as the way the $\alpha$th bit belonging to the lowest four bits (the third to zeroth bits) changes as the Gray code counter 2 counts from 0 to 15 (see FIG. 2). Here, where M=1, $\alpha$ is a whole number in the range from 0 to 3.

When counting is performed with $2^M-1$ counts skipped at a time and M=2, i.e. when counting is performed with three counts skipped at a time, the Gray code counter 1 of the first embodiment counts in this way: 0, 4, 8, . . . . FIG. 4 is a diagram showing decimal counts and the corresponding Gray code in a case where counting is performed with three counts skipped at a time. As will be clear from the FIG. 4, in the Gray code obtained by counting with three counts skipped at a time, the zeroth bit (the lowest bit) is kept constant at "0." The first bit is initially at "0," and is inverted every time the count changes. The way the ($\alpha$+2)th bit belonging to the highest three bits (the fourth to second bits) changes every time the count changes is the same as the way the $\alpha$th bit belonging to the lowest three bits (the second to zeroth bits) changes as the Gray code counter 2 counts from 0 to 7 (see FIG. 2). Here, where M=2, $\alpha$ is a whole number in the range from 0 to 2.

When counting is performed with $2^M-1$ counts skipped at a time and M=3, i.e. when counting is performed with seven counts skipped at a time, the Gray code counter 1 of the first embodiment counts in this way: 0, 8, 16, 24, . . . . FIG. 5 is a diagram showing decimal counts and the corresponding Gray code in a case where counting is performed with seven counts skipped at a time. As will be clear from the FIG. 5, in the Gray code obtained by counting with seven counts skipped at a time, the zeroth bit (the lowest bit) and the first bit are kept constant at "0." The second bit is initially at "0," and is inverted every time the count changes. The way the ($\alpha$+3)th bit belonging to the highest two bits (the fourth to third bits) changes every time the count changes is the same as the way the $\alpha$th bit belonging to the lowest two bits (the first to zeroth bits) changes as the Gray code counter 2 counts from 0 to 3 (see FIG. 2). Here, where M=3, $\alpha$ is a whole number in the range from 0 to 1.

Naturally, this relationship applies also in cases where the Gray code used consists of a larger number of bits. Specifically, with a Gray code counter of an N-bit type, in the Gray code output data obtained by counting with $2^M$–1 counts skipped at a time, the ($\alpha$+M)th bit belonging to the highest (N–M) bits has the same sign as the $\alpha$th bit belonging to the lowest (N–M) bits of the Gray code output data obtained by consecutive counting; the (M–1)th bit is initially at "0," and is inverted every time the count changes; and the (N–2)th and lower bits are kept constant at "0."

Figure 6:
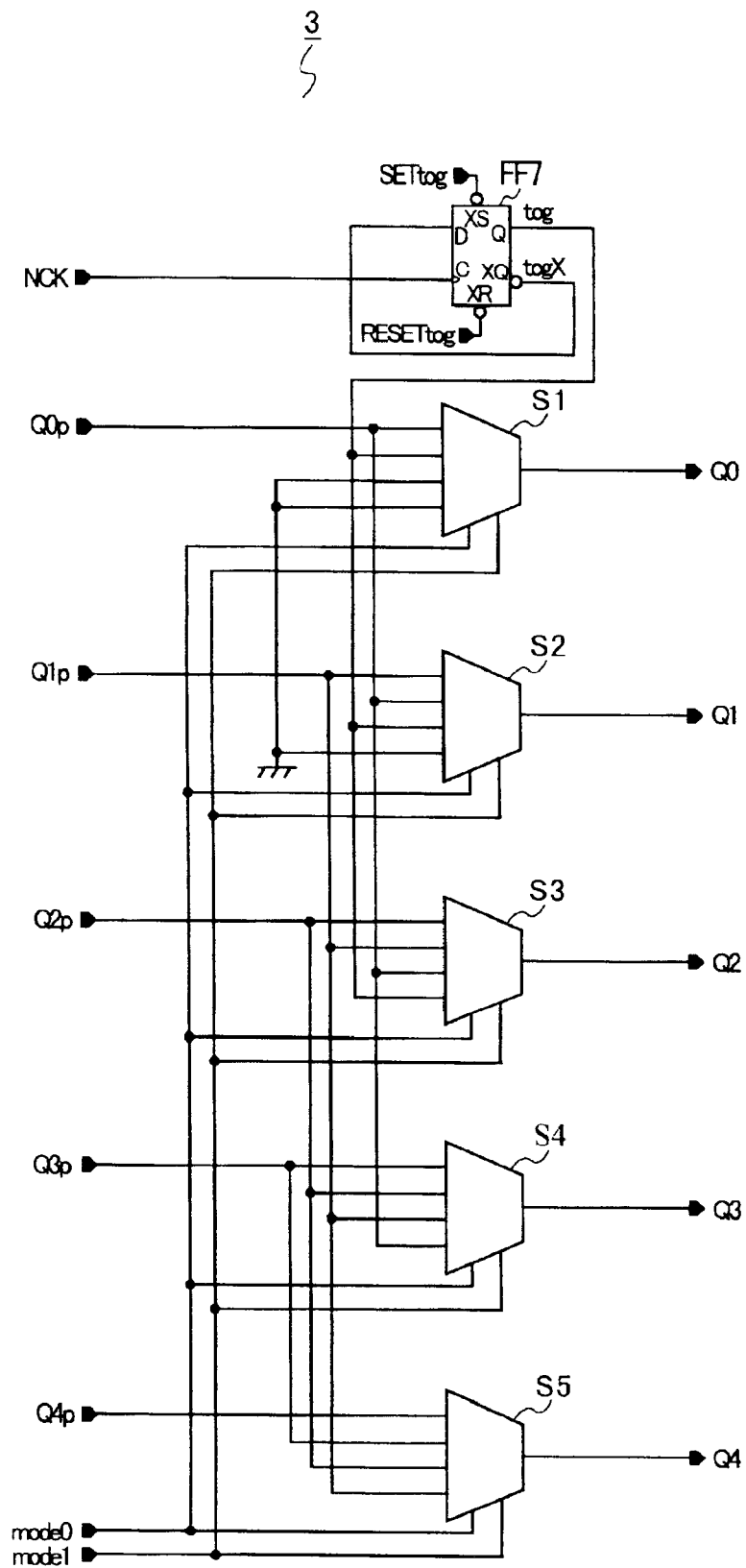
FIG. 6 is a diagram showing an example of the configuration of the output value converter provided in the Gray code counter shown in FIG. 1.

Thus, when counting is performed with $2^M$–1 counts skipped at a time, the output value converter 3 needs to operate in such a way as to output the highest (N–M) bits by using as the data of the ($\alpha$+M)th bit the data of the $\alpha$th bit belonging to the lowest (N–M) bits of the Gray code counter output, and output the remaining lowest M bits by inverting the data of the (M–1)th bit every time the count changes and by keeping the data of the (M–2)th and lower bits, if any, constant at "0." This makes the logic circuit of the output value converter 3 easy to implement. When N=5, the output value converter 3 is realized, for example, with a circuit configuration as shown in FIG. 6.

Now, the output value converter 3 shown in FIG. 6 will be described. The first input terminal of a selector S1, the second input terminal of a selector S2, the third input terminal of a selector S3, and the fourth input terminal of a selector S4 are connected together, and to these input terminals are fed the zeroth-bit data Q0p of the Gray code counter 2. The first input terminal of the selector S2, the second input terminal of the selector S3, the third input terminal of the selector S4, and the fourth input terminal of a selector S5 are connected together, and to these input terminals are fed the first-bit data Q1p of the Gray code counter 2. The first input terminal of the selector S3, the second input terminal of the selector S4, and the third input terminal of the selector S5, are connected together, and to these input terminals are fed the second-bit data Q2p of the Gray code counter 2. The first input terminal of the selector S4 and the second input terminal of the selector S5 are connected together, and to these input terminals are fed the third-bit data Q3p of the Gray code counter 2. To the first input terminal of the selector S4 is fed the fourth-bit data Q4p of the Gray code counter 2.

The second input terminal of the selector S1, the third input terminal of the selector S2, and the fourth input terminal of the selector S3 are connected together, and these input terminals are connected to the Q output terminal of a flip-flop FF7. The third and fourth input terminals of the selector S1 and the fourth input terminal of the selector S2 are grounded.

The first control signal mode0 is fed to the first control terminal of each of the selectors S1 to S4, and the second control signal mode1 is fed to the second control terminal of each of the selectors S1 to S4. The selectors S1 to S4 operate in the following manner: when they receive a low-level signal at both of their first and second control terminals, they output the signal they receive at their first input terminal; when they receive a high-level signal at their first control terminal and a low-level signal at their second control terminal, they output the signal they receive at their second input terminal; when they receive a low-level signal at their first control terminal and a high-level signal at their second control terminal, they output the signal they receive at their third input terminal; and when they receive a high-level signal at both of their first and second control terminals, they output the signal they receive at their fourth input terminal.

Thus, the output value converter 3 outputs bit data as shown in FIG. 7. When the first and second control signals mode0 and mode1 are both at "0," the Gray code counter 1 of the first embodiment counts consecutively; when the first control signal mode0 is at "1" and the second control signal mode1 is at "0," the Gray code counter 1 of the first embodiment counts with one count skipped at a time; when the first control signal mode0 is at "0" and the second control signal mode1 is at "1," the Gray code counter 1 of the first embodiment counts with three counts skipped at a time; and when the first and second control signals mode0 and mode1 are both at "1," the Gray code counter 1 of the first embodiment counts with seven counts skipped at a time.

This makes it possible to count with $2^M$–1 (M=1 to 3) counts skipped at a time, while keeping the number of simultaneously changing bits constant at 2. This makes it possible to perform interlaced counting while reducing electric noise. Moreover, it is possible to switch between consecutive counting and counting with $2^M$–1 (M=1 to 3) counts skipped at a time. This makes the Gray code counter of this embodiment usable in wider application than a Gray code counter designed exclusively for interlaced counting.

Next, the Gray code counter of a second embodiment of the invention will be described. The Gray code counter of the first embodiment described above can only start counting at "0." However, in a solid-state image sensor, to permit a portion of the screen to be cut out, it is necessary to use a decoder-type scanning circuit that can scan from a specified address to a specified address, i.e. that permits random access. That is, it is necessary to use a counter that permits the counts at which to start and stop counting to be specified freely.

Figure 8:
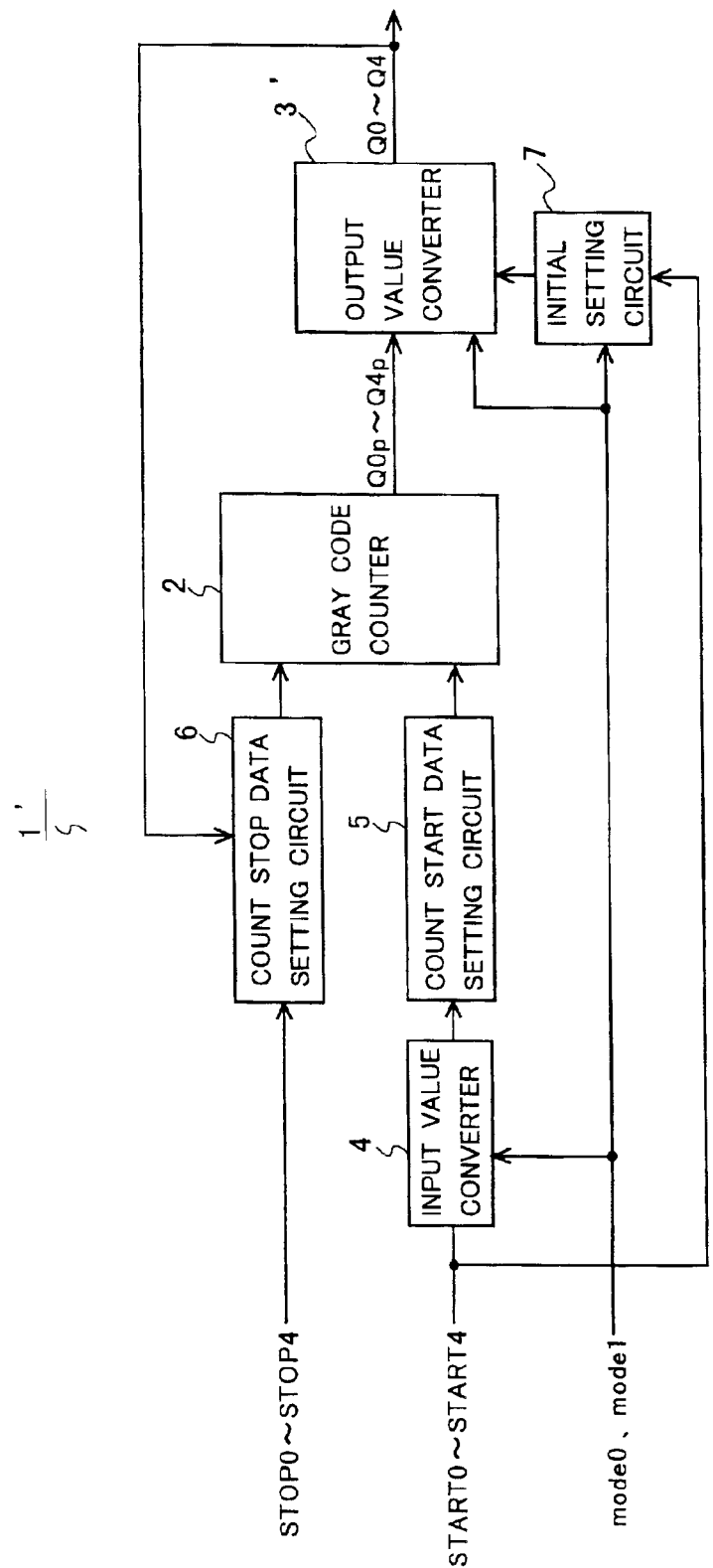
FIG. 8 is a configuration diagram of the Gray code counter of a second embodiment of the invention.

Accordingly, the Gray code counter of the second embodiment is configured as shown in FIG. 8 so that it permits the counts at which to start and stop counting to be specified freely. The Gray code counter of the second embodiment, like that of the first embodiment, is of a five-bit type. In FIG. 8, such circuit blocks as are found also in FIG. 1 are identified with the same reference numerals, and their explanations will not be repeated.

The Gray code data START0 to START4 corresponding to the value at which to start counting is fed to an input value converter 4 and to an initial setting circuit 7. The input value converter 4 converts the Gray code data START0 to START4 of the value at which to start counting according to the control signals mode0 and mode1, and outputs the converted data to a count start data setting circuit 5. On the basis of the bit data fed from the input value converter 4, the count start data setting circuit 5 controls the initial state of the Gray code counter 2.

On the other hand, the initial setting circuit 7 controls the initial state of the output value converter 3' according to the Gray code data START0 to START4 of the value at which to start counting and the control signals mode0 and mode1. The output value converter 3' converts the output data Q0$p$ to Q4$p$ of the Gray code counter 2, and outputs Gray code data Q0 to Q4.

Moreover, according to the Gray code data STOP0 to STOP4 of the value at which to stop counting and the output data Q0 to Q4 of the output value converter 3', a count stop data setting circuit 6 controls the clock signal that is fed to the Gray code counter 2.

Next, examples of the configuration of the individual circuit blocks of the Gray code counter of the second embodiment shown in FIG. 8 will be described. First, the output value converter 3' and the initial setting circuit 7 will be described.

Now, the relationship, as observed in a case where counting is started at a specified value, between the Gray code decimal output data obtained by consecutive counting and the Gray code output data obtained by counting with $2^M-1$ counts skipped at a time will be considered.

When counting is performed with $2^M-1$ counts skipped at a time and M=1, i.e. when counting is performed with one count skipped at a time, such counting is possible by starting at either "0" or "1," which are to be dealt with as different cases. FIG. 17A is a diagram showing decimal counts and the corresponding Gray code in a case where counting is started at "0," and FIG. 17B is a diagram showing decimal counts and the corresponding Gray code in a case where counting is started at "1."

As will be clear from FIG. 17A, when the decimal count of the value at which counting is started is an even number, counting is performed in the same manner as when counting is started at "0" except that the initial value at which counting is started differs. Moreover, as will be clear from FIG. 17B, when the decimal count of the value at which counting is started is an odd number, counting is performed in the same manner as when counting is started at "1" except that the initial value at which counting is started differs.

Furthermore, FIGS. 17A and 17B show that, irrespective of whether the value at which counting is started is an even or odd number, a fixed relationship exists between the Gray code output data obtained by consecutive counting and the Gray code output data obtained by counting with one count skipped at a time. Specifically, in the Gray code obtained by counting with one count skipped at a time, the zeroth bit (the lowest bit) is initially equal to the zeroth bit of the value at which counting is started, and is then inverted every time the count changes. Moreover, in the Gray code obtained by counting with one count skipped at a time, the way the $(\alpha+1)$th bit belonging to the highest four bits (the fourth to first bits) of the Gray code changes as the count changes is the same as the way the $\alpha$th bit belonging to the lowest four bits (the third to zeroth bits) of the Gray code obtained by consecutive counting changes as the count changes (see FIG. 2). Here, where M=1, $\alpha$ is a whole number in the range from 0 to 3.

When counting is performed with $2^M-1$ counts skipped at a time and M=2, i.e. when counting is performed with three counts skipped at a time, such counting is possible by starting at "0," "1," "2," or "3," which are to be dealt with as different cases. FIG. 18A is a diagram showing decimal counts and the corresponding Gray code in a case where counting is started at "0," FIG. 18B is a diagram showing decimal counts and the corresponding Gray code in a case where counting is started at "1," FIG. 18C is a diagram showing decimal counts and the corresponding Gray code in a case where counting is started at "2," and FIG. 18D is a diagram showing decimal counts and the corresponding Gray code in a case where counting is started at "3."

As will be clear from FIG. 18A, when the decimal count of the value at which counting is started is a multiple of 4, counting is performed in the same manner as when counting is started at "0" except that the initial value at which counting is started differs. Moreover, as will be clear from FIG. 18B, when the decimal count of the value at which counting is started is a multiple of 4 plus 1, counting is performed in the same manner as when counting is started at "1" except that the initial value at which counting is started differs. Moreover, as will be clear from FIG. 18C, when the decimal count of the value at which counting is started is a multiple of 4 plus 2, counting is performed in the same manner as when counting is started at "2" except that the initial value at which counting is started differs. Moreover, as will be clear from FIG. 18D, when the decimal count of the value at which counting is started is a multiple of 4 plus 3, counting is performed in the same manner as when counting is started at "3" except that the initial value at which counting is started differs.

Furthermore, FIGS. 18A to 18D show that, irrespective of the value at which counting is started, a fixed relationship exists between the Gray code output data obtained by consecutive counting and the Gray code output data obtained by counting with three counts skipped at a time. Specifically, in the Gray code obtained by counting with three counts skipped at a time, the zeroth bit (the lowest bit) is all the time kept equal to the zeroth bit of the value at which counting is started. Moreover, in the Gray code obtained by counting with three counts skipped at a time, the first bit is initially equal to the first bit of the value at which counting is started, and is then inverted every time the count changes. Moreover, in the Gray code obtained by counting with three counts skipped at a time, the way the $(\alpha+2)$th bit belonging to the highest three bits (the fourth to second bits) of the Gray code changes as the count changes is the same as the way the $\alpha$th bit belonging to the lowest three bits (the second to zeroth bits) of the Gray code obtained by consecutive counting changes as the count changes (see FIG. 2). Here, where M=2, $\alpha$ is a whole number in the range from 0 to 2.

When counting is performed with $2^M-1$ counts skipped at a time and M=3, i.e. when counting is performed with seven counts skipped at a time, such counting is possible in eight different cases that can be dealt with in similar manners to the cases described above that are possible when M=1 or 2. Therefore, the description of the individual cases that are possible when M=3 will be omitted.

Naturally, this relationship applies also in cases where the Gray code used consists of a larger number of bits. Specifically, with an N-bit Gray code, in the Gray code obtained by counting with $2^M-1$ bits skipped at a time, the way the $(\alpha+M)$th bit belonging to the highest (N-M) bit of the Gray code changes as the count changes is the same as the way the $\alpha$th bit belonging to the lowest (N-M) bits of the Gray code obtained by consecutive counting changes as the count changes. Moreover, in the Gray code obtained by counting with $2^M-1$ bits skipped at a time, the (M-1)th bit of the Gray code is initially equal to the (M-1)th bit of the value at which counting is started, and is then inverted every time the count changes. Furthermore, in the Gray code obtained by counting with $2^M-1$ bits skipped at a time, the $\beta$th bit of the Gray code, if it contains an (M-2)th or any lower bit, is all the time kept equal to the $\beta$th bit of the value at which counting is started.

Thus, the output value converter 3' needs to operate in such a way as to output the highest (N−M) bits by using as the data of the (α+M)th bit the data of the αth bit belonging to the lowest (N−M) bits of the Gray code data output from the Gray code counter 2, and output the remaining lowest M bits by initially setting the (M−1)th bit equal to the (M−1)th bit of the value at which counting is started and thereafter inverting it every time the cont changes and, if an (M−2)th or any lower bit exists, by using as the data of the βth bit the data of the βth bit belonging to the (M−2)th and lower bits of the Gray code data output from the Gray code counter 2 when counting is started. When N=5, the output value converter 3', which operates as described above, is realized, for example, with a circuit configuration as shown in FIG. 15.

Figure 15:
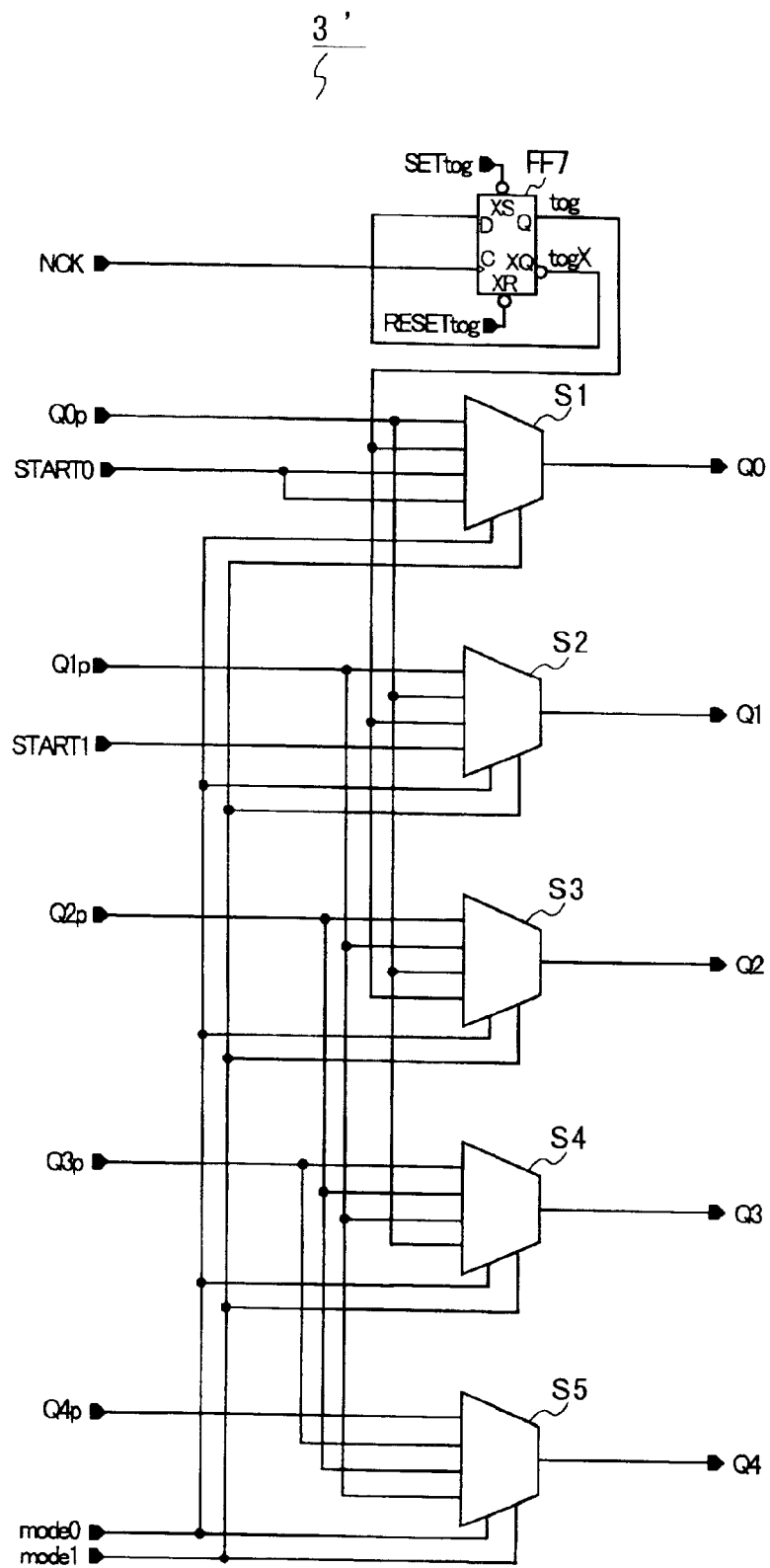
FIG. 15 is a diagram showing an example of the configuration of the output value converter provided in the Gray code counter shown in FIG. 8.

In FIG. 15, such circuit elements as are found also in FIG. 6 are identified with the same reference numerals, and only the differences from the interconnection shown in FIG. 6 will be described below. The third and fourth input terminals of the selector S1 are connected together, and to these input terminals is fed the zeroth-bit data START0 of the value at which counting is started. To the fourth input terminal of the selector S2 is fed the first-bit data START1 of the value at which counting is started.

The flip-flop FF7 outputs an inverting signal "tog," of which the initial value varies according to the type of counting to be performed and the value at which to start counting. FIG. 19 shows the bit data output from the output value converter 3'. When consecutive counting is performed, the output bit data Q0p to Q4p is output intact. Therefore, the initial value of the inverting signal "tog" may be any value.

When counting is performed with one count skipped at a time, the initial value of the inverting signal "tog" is set equal to the value of the zeroth bit START0 of the value at which to start counting. When counting is performed with three counts skipped at a time, the initial value of the inverting signal "tog" is set equal to the value of the first bit START1 of the value at which to start counting. When counting is performed with seven counts skipped at a time, the initial value of the inverting signal "tog" is set equal to the value of the second bit START2 of the value at which to start counting.

Figure 16:
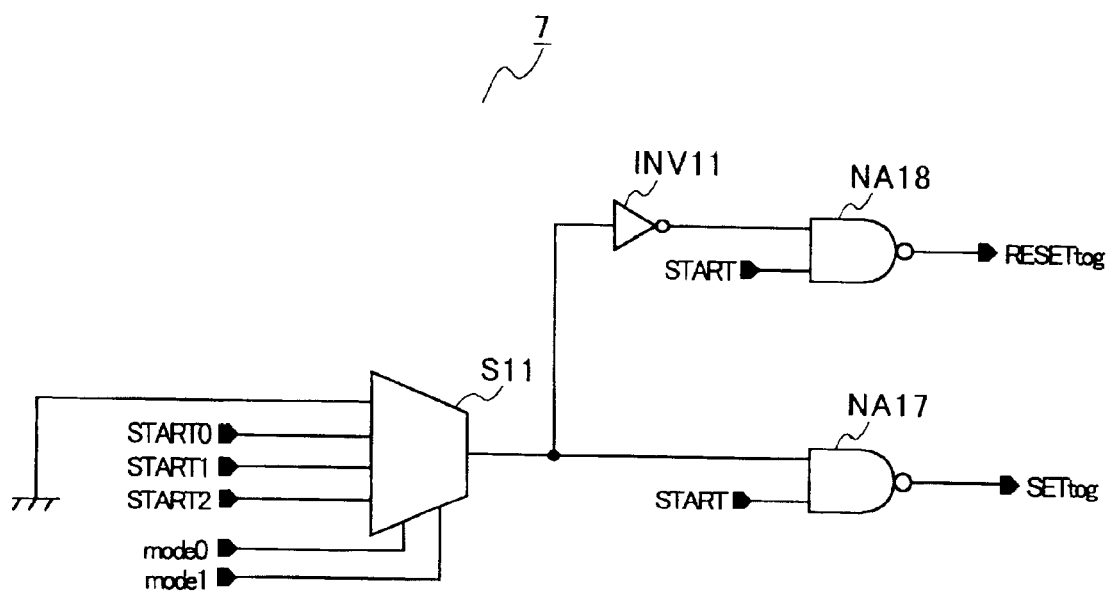
FIG. 16 is a diagram showing an example of the configuration of the initial setting circuit provided in the Gray code counter shown in FIG. 8.

The initial setting circuit 7, which outputs a set signal SETtog and a reset signal RESETtog to the flip-flop FF7 so as to set the initial value of the inverting signal "tog" as described above, is realized, for example, with a circuit configuration as shown in FIG. 16.

The output terminal of a selector S11 is connected to the first input terminal of a NAND circuit NA17 and to an inverter circuit INV11, and the output signal of the inverter circuit INV11 is fed to the first input terminal of a NAND circuit NA18. Moreover, a start signal START is fed to the second input terminal of each of the NAND circuits NA17 and NA18. The NAND circuit NA17 outputs a set signal SETtog, and the NAND circuit NA18 outputs a reset signal RESETtog.

When the initial setting circuit 7 is configured as shown in FIG. 16, the flip-flop FF7 can be operated normally by turning the start signal START to "0" and the set and reset signals SETtog and RESETtog to "1."

To start counting, the start signal START is turned to "1." Here, if the output signal of the selector S11 is at "1," the set signal SETtog turns to "0" and the reset signal RESETtog turns to "1"; if the output signal of the selector S11 is at "0," the set signal SETtog turns to "1" and the reset signal RESETtog turns to "0." In this way, the sign of the signal "tog" output from the Q terminal of the flip-flop FF7 is made equal to that of the output signal of the selector S11.

The first control signal mode0 is fed to the first control terminal of the selector S11, and the second control signal mode1 is fed to the second control terminal of the selector S11. The selector S11 operates in the following manner: when it receives a low-level signal at both of its first and second control terminals, it outputs the signal it receives at its first input terminal; when it receives a high-level signal at its first control terminal and a low-level signal at its second control terminal, it outputs the signal it receives at its second input terminal; when it receives a low-level signal at its first control terminal and a high-level signal at its second control terminal, it outputs the signal it receives at its third input terminal; and when it receives a high-level signal at both of its first and second control terminals, it outputs the signal it receives at its fourth input terminal. The selector S11 has its first input terminal grounded, receives at its second input terminal the data of the zeroth bit START0 of the value at which to start counting, receives at its third input terminal the data of the first bit START1 of the value at which to start counting, and receives at its fourth input terminal the data of the second bit START2 of the value at which to start counting.

With the initial setting circuit 7 configured as described above, when counting is performed with one count skipped at a time, it is possible to make the sign of the initial value of the inverting signal "tog" equal to that of the data of the zeroth bit START0 of the value at which to start counting; when counting is performed with three counts skipped at a time, it is possible to make the sign of the initial value of the inverting signal "tog" equal to that of the data of the first bit START1 of the value at which to start counting; when counting is performed with seven counts skipped at a time, it is possible to make the sign of the initial value of the inverting signal "tog" equal to that of the data of the second bit START2 of the value at which to start counting.

Next, the input value converter 4 will be described. As described above, when counting is performed with $2^M-1$ counts skipped at a time, the output value converter 3' converts the Gray code output data obtained as a result of the Gray code counter 2 counting consecutively into the Gray code output data obtained by counting with $2^M-1$ counts skipped at a time. Thus, when counting is performed with $2^M-1$ counts skipped at a time, the input value converter 4 needs to feed the Gray code counter 2 with the bit data (START4 to START0) of the value at which to start counting after converting it into the Gray code output data as obtained by consecutive counting.

Figure 9:
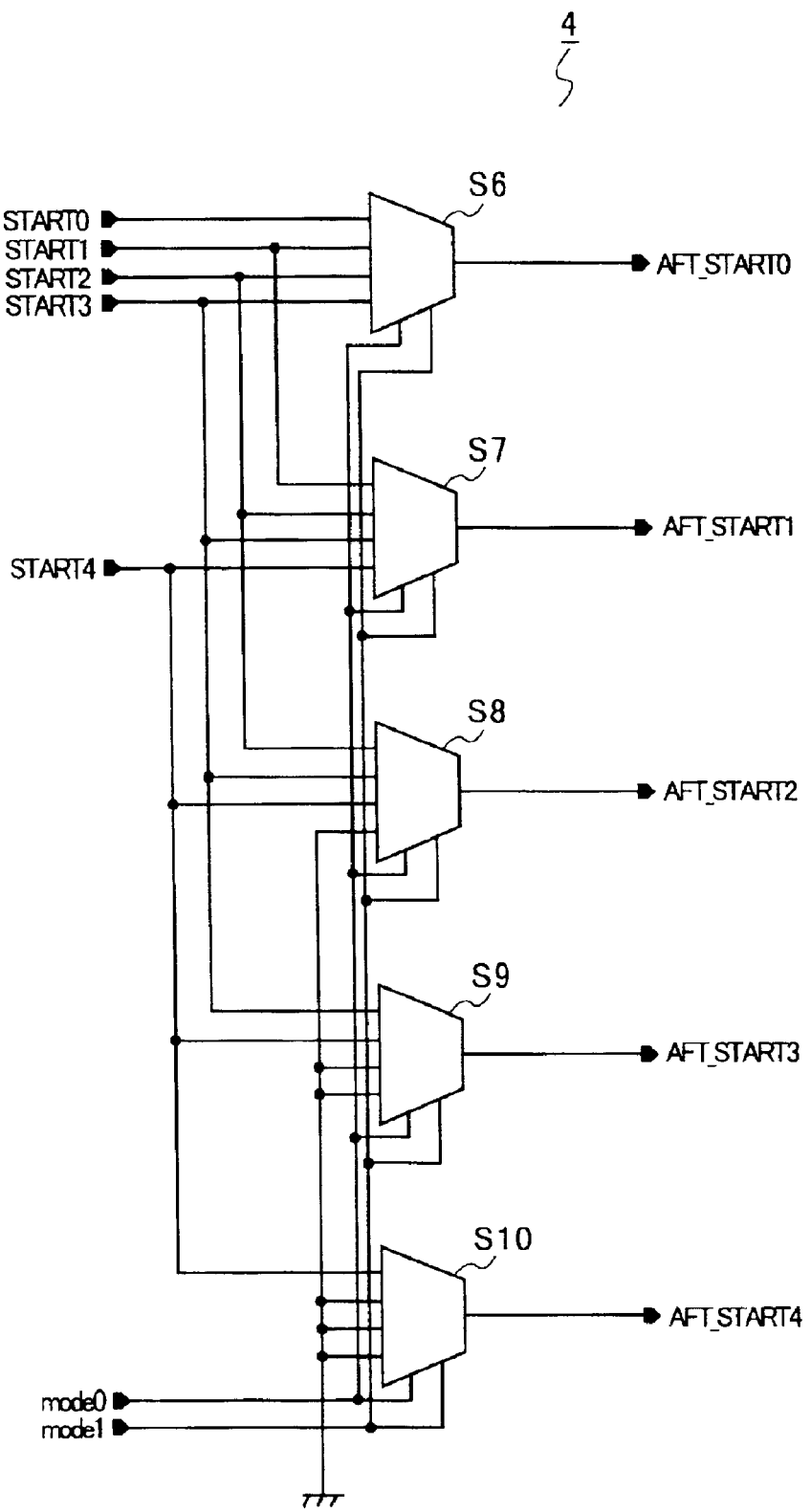
FIG. 9 is a diagram showing an example of the configuration of the input value converter provided in the Gray code counter shown in FIG. 8.

Thus, the input value converter 4 needs to operate in such a way as to use as the data of the αth bit belonging to the lowest (N−M) bits of the output data the data of the (α+M)th bit belonging to the highest (N−M) bits of the value at which to start counting, and keep the highest M bits constant at "0." When N=5, the input value converter 4, which operates as described above, is realized, for example, with a circuit configuration as shown in FIG. 9.

Now, the input value converter 4 shown in FIG. 9 will be described. To the first input terminal of a selector S6 is fed the zeroth-bit data START0 of the value at which to start counting. The second input terminal of the selector S6 and the first input terminal of a selector S7 are connected together, and to these input terminals is fed the first-bit data START1 of the value at which to start counting. The third input terminal of the selector S6, the second input terminal of the selector S7, and the first input terminal of a selector S8 are connected together, and to these input terminals is fed the second-bit data START2 of the value at which to start counting. The fourth input terminal of the selector S6, the third input terminal of the selector S7, the second input terminal of the selector S8, and the first input terminal of a selector S9 are connected together, and to these input terminals is fed the third-bit data START3 of the value at which to start counting. The fourth input terminal of the selector S7, the third input terminal of the selector S8, the second input terminal of the selector S9, and the first input terminal of a selector S10 are connected together, and to these input terminals is fed the fourth-bit data START4 of the value at which to start counting. The fourth input terminal of the selector S8, the third and fourth input terminals of the selector S9, and the second to fourth input terminals of the selector S10 are connected together and grounded.

Moreover, the first control signal mode0 is fed to the first control terminal of each of the selectors S6 to S10, and the second control signal mode1 is fed to the second control terminal of each of the selectors S6 to S10. The selectors S6 to S10 operate in the following manner: when they receive a low-level signal at both of their first and second control terminals, they output the signal they receive at their first input terminal; when they receive a high-level signal at their first control terminal and a low-level signal at their second control terminal, they output the signal they receive at their second input terminal; when they receive a low-level signal at their first control terminal and a high-level signal at their second control terminal, they output the signal they receive at their third input terminal; and when they receive a high-level signal at both of their first and second control terminals, they output the signal they receive at their fourth input terminal. Thus, the input value converter 4 outputs bit data as shown in FIG. 20.

Figure 10:
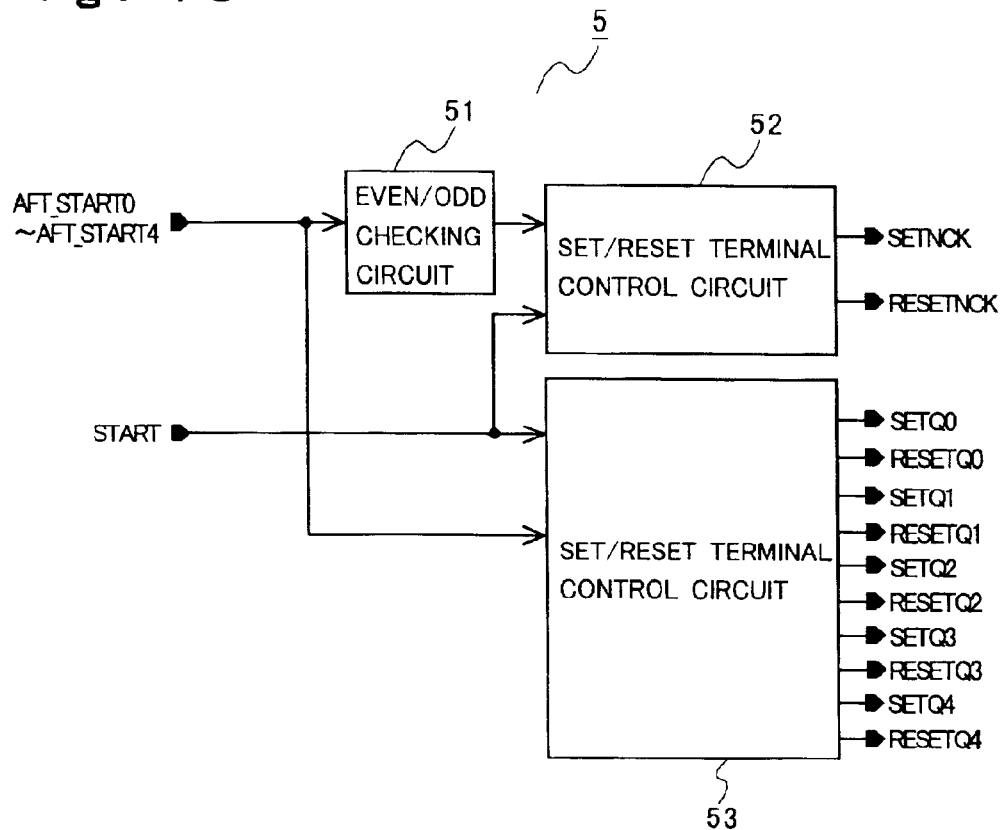
FIG. 10 is a configuration diagram of the count start data setting circuit provided in the Gray code counter shown in FIG. 8.
Figure 11:
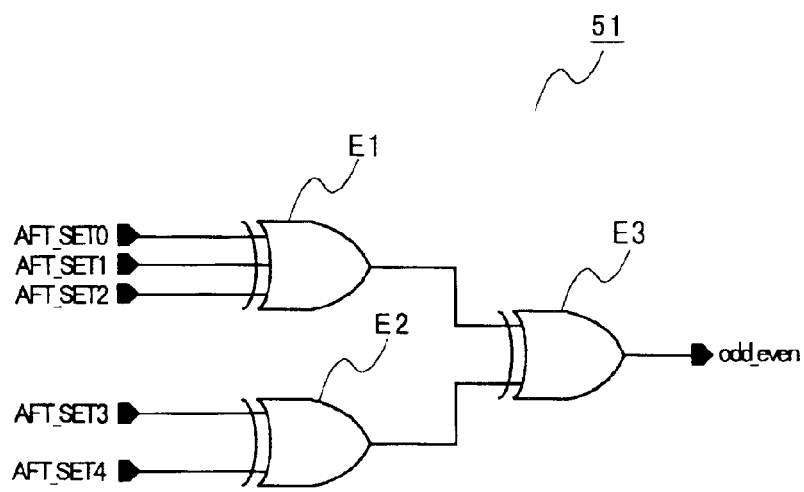
FIG. 11 is a diagram showing an example of the configuration of the even/odd checking circuit provided in the count start data setting circuit shown in FIG. 10.

Next, the count start data setting circuit 5 will be described. FIG. 10 shows a circuit bock diagram of an example of the configuration of the count start data setting circuit 5. An even/odd checking circuit 51 outputs "0" when the decimal count is an even number, and outputs "1" when the decimal count is an odd number. When the decimal count is an even number, the Gray code includes an even number of "1"s, and, when the decimal count is an odd number, the Gray code includes an odd number of "1"s. Therefore, the even/odd checking circuit 51 is realized, for example, as a logic circuit as shown in FIG. 11.

Bit data AFT_START0 to AFT_START2 is fed to an exclusive OR circuit E1, and bit data AFT_START3 and AFT_START4 is fed to an exclusive OR circuit E2. The output signals of the exclusive OR circuits E1 and E2 are fed to an exclusive OR circuit E3, which then outputs an even/odd signal "odd_even."

On the basis of the even/odd signal "odd_even" output from the even/odd checking circuit 51, a set/reset terminal control circuit 52 produces control signals to be fed to the XS and XR terminals of the flip-flop FF6.

To make the flip-flop FF6 output "0" at its Q terminal, the set/reset terminal control circuit 52 turns the set signal SETNCK it feeds to the XS terminal of the flip-flop FF6 to "1" and turns the reset signal RESETNCK it feeds to the XR terminal of the flip-flop FF6 to "0." To make the flip-flop FF6 output "1" at its Q terminal, the set/reset terminal control circuit 52 turns the set signal SETNCK it feeds to the XS terminal of the flip-flop FF6 to "0" and turns the reset signal RESETNCK it feeds to the XR terminal of the flip-flop FF6 to "1." To make the flip-flop FF6 operate normally, the set/reset terminal control circuit 52 turns the set signal SETNCK it feeds to the XS terminal of the flip-flop FF6 to "1" and turns the reset signal RESETNCK it feeds to the XR terminal of the flip-flop FF6 to "1."

An example of the configuration of the set/reset terminal control circuit 52, which operates as described above, is shown in FIG. 12. The even/odd signal "odd_even" is fed to the first input terminal of a NAND circuit NA5 and to an inverter circuit INV5, and the output signal of the inverter circuit INV5 is fed to the first input terminal of a NAND circuit NA6. Moreover, the start signal START is fed to the second input terminal of each of the NAND circuits NA5 and NA6. The NAND circuit NA5 outputs the set signal SETNCK, and the NAND circuit NA6 outputs the reset signal RESETNCK.

Figure 12:
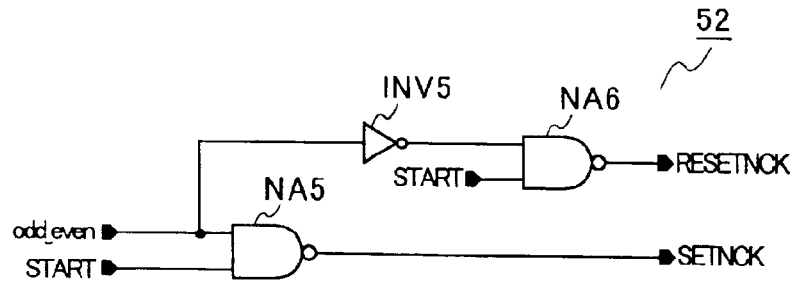
FIG. 12 is a diagram showing an example of the configuration of one of the set/reset terminal control circuits provided in the count start data setting circuit shown in FIG. 10.

When the set/reset terminal control circuit 52 is configured as shown in FIG. 12, the flip-flop FF6 can be operated normally by turning the start signal START to "0" and the set and reset signals SETNCK and RESETNCK to "1."

Figure 23:
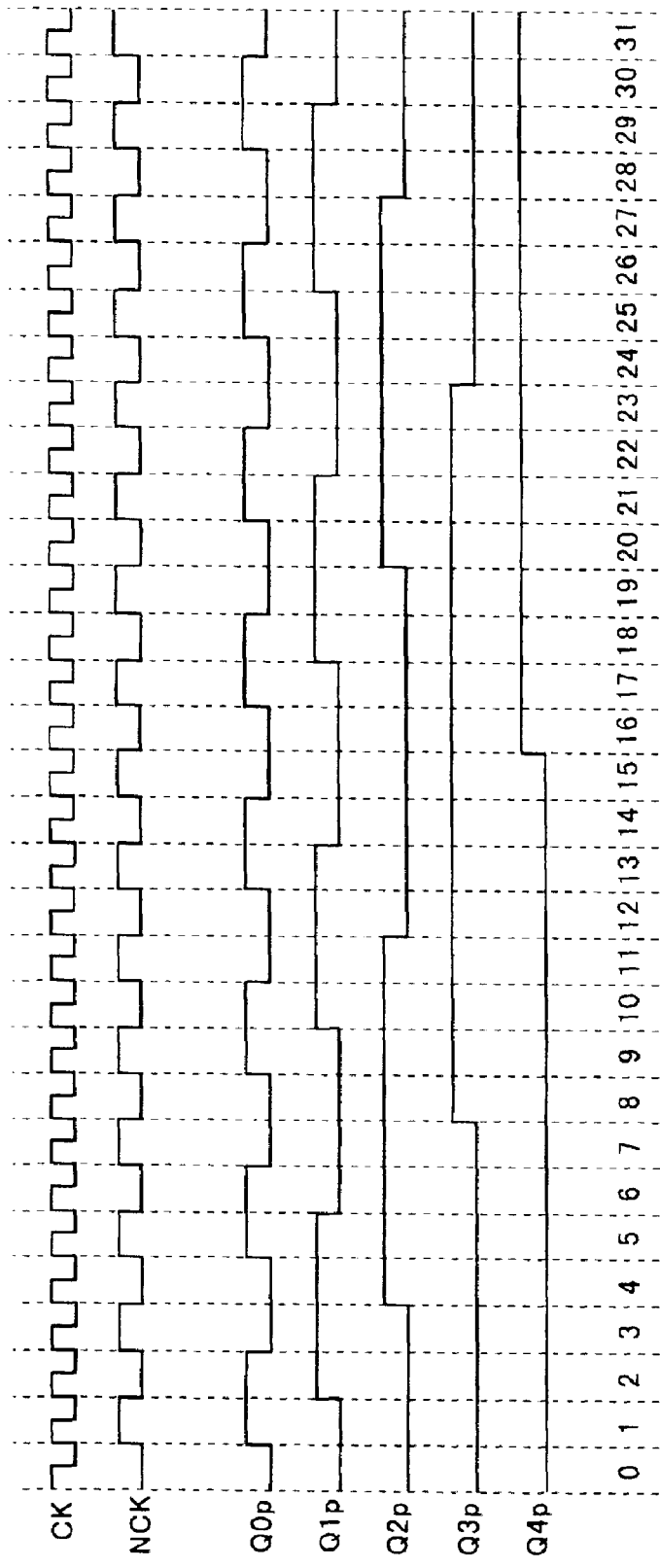
FIG. 23 is a time chart showing the operation of the Gray code counter shown in FIG. 22.

To start counting, the start signal START is turned to "1." Here, if the even/odd signal "odd_even" is at "1" (i.e. when the decimal count corresponding to the bit data AFT_START0 to AFT_START4 is an odd number), the set signal SETNCK turns to "0" and the reset signal RESETNCK turns to "1." When the even/odd signal "odd_even" is at "0" (i.e. when the decimal count corresponding to the bit data AFT_START0 to AFT_START4 is an even number), the set signal SETNCK turns to "1" and the reset signal RESETNCK turns to "0." In this way, as shown in FIG. 23, it is possible, when the decimal count corresponding to the bit data AFT_START0 to AFT_START4 is an odd number, to turn the ½ clock signal NCK that the flip-flop FF6 outputs at its Q output terminal to "1" and, when the decimal count corresponding to the bit data AFT_START0 to AFT_START4 is an even number, to turn the ½ clock signal NCK that the flip-flop FF6 outputs at its Q output terminal to "0."

On the basis of the bit data AFT_START0 to AFT_START4, another set/reset terminal control circuit 53 produces control signals to be fed to the XS and XR terminals of the flip-flops FF1 to FF5.

Figure 13:
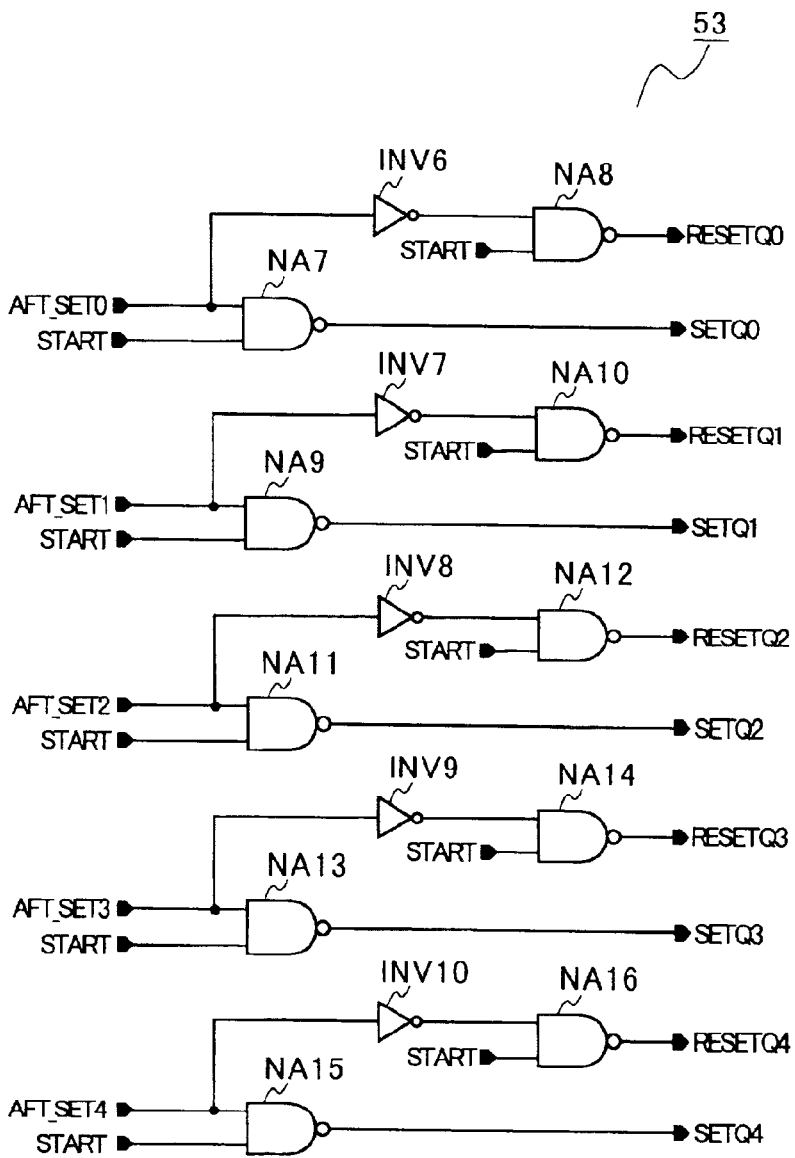
FIG. 13 is a diagram showing an example of the configuration of the other of the set/reset terminal control circuit provided in the count start data setting circuit shown in FIG. 10.

An example of the configuration of the set/reset terminal control circuit 53 is shown in FIG. 13. The set/reset terminal control circuit 53 is provided with five circuits each having the same configuration as the set/reset terminal control circuit 52. These five circuits receive, instead of the even/odd signal "odd_even," the bit data AFT_START0, AFT_START1, AFT_START2, AFT_START3, and AFT_START4, respectively.

Thus, when the start signal START is turned to "1," the Gray code counter 2 outputs the bit data AFT_START0, AFT_START1, AFT_START2, AFT_START3, and AFT_START4; when the start signal START is turned to "0," the flip-flops FF1 to FF5 operate normally, and therefore the Gray code counter 2 performs counting. In this way, by configuring a Gray code counter to permit the count at which to start counting to be specified freely, it is possible to make it usable in wider application.

Figure 14:
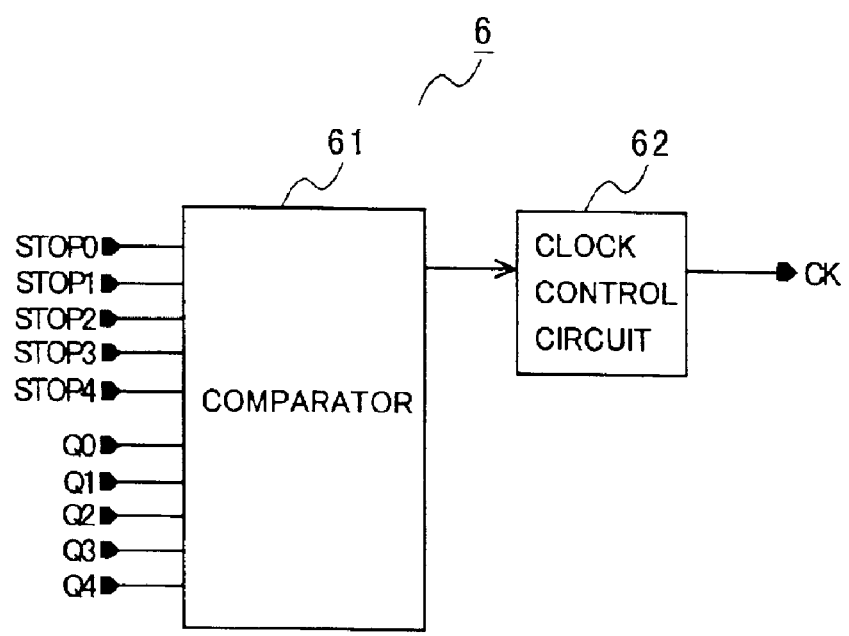
FIG. 14 is a configuration diagram of the count stop data setting circuit provided in the Gray code counter shown in FIG. 8.

Next, the count stop data setting circuit 6 will be described. FIG. 14 shows a circuit block diagram of an example of the configuration of the count stop data setting circuit 6. A comparator 61 compares the Gray code data STOP0 to STOP4 of the value at which to stop counting with the output signals Q0, Q1, Q2, Q3, and Q4 of the Gray code counter 1', and, if these two sets of data coincide in all of the lowest, first, second, third, and highest bits, feeds a control signal to a clock control circuit 62 to instruct it to stop outputting the clock signal CK. As a result, the clock signal CK ceases to be fed to the Gray code counter 2, and thus the Gray code counter 1' stops counting. In a case where the Gray code counter 1' counts with $2^M-1$ counts skipped at a time, the Gray code data STOP0 to STOP4 of the value at which to stop counting needs to be a value that suits the value at which counting is started and the number of counts skipped at a time. For example, in a case where counting is performed starting at the decimal count "0" and with one count skipped at a time, the value at which to stop counting needs to be an even number.

Next, an example of a camera system according to the invention will be described with reference to FIG. 21. An optical lens system 11 picks up an optical real image (not shown) as a target of image sensing, and images it on a solid-state image sensing element 15 provided in a solid-state image sensor 12.

The solid-state image sensing element 15 has 1,024 photoelectric conversion elements 15a arranged in a matrix (32×32). The photoelectric conversion elements 15a are each connected to one of vertical-direction selection lines 15b and to one of horizontal-direction selection lines 15c. One of the vertical-direction selection lines 15b is selected by a vertical-direction decoder 15d, and one of the horizontal-direction selection lines 15c is selected by a horizontal-direction decoder 15e.

The vertical-direction decoder 15d selects the address specified by a vertical-direction Gray code counter 15f, and the horizontal-direction decoder 15e selects the address specified by a horizontal-direction Gray code counter 15g. The signal of the photoelectric conversion element 15a at the address specified by both of the selected vertical-selection line 15b and the selected horizontal-selection line 15c is fed to an output circuit 15h.

With the count output from the vertical-direction Gray code counter 15f fixed, and thus with the address in the vertical direction fixed, the horizontal-direction Gray code counter 15g is made to count to perform scanning in the horizontal direction along one horizontal line. On completion of the scanning along this horizontal line, the vertical-direction Gray code counter 15f is made to count so that scanning is then performed along the next horizontal line. This is repeated so as to achieve image sensing. Here, the vertical-direction Gray code counter 15f and the horizontal-direction Gray code counter 15g have the same configuration as the 5-bit Gray code counter 1' of the second embodiment described above.

A vertical-direction control circuit 16a controls the vertical-direction Gray code counter 15f by feeding it with the Gray code data START0 to START4 of the value at which to start counting, the Gray code data STOP0 to STOP4 of the value at which to stop counting, and control signals mode0 and mode1. A horizontal-direction control circuit 16b controls the horizontal-direction Gray code counter 15g by feeding it with the Gray code data START0' to START4' of the value at which to start counting, the Gray code data STOP0' to STOP4' of the value at which to stop counting, and control signals mode0' and mode1'.

The output circuit 15h outputs a signal voltage to a signal processing circuit 13 in the following stage. On the basis of the signal voltage output from the output circuit 15h, the signal processing circuit 13 produces a drive signal and feeds it to a display device 14. The display device 14 has 256 pixels arranged in a matrix (16×16).

This configuration permits the camera system 10 to be furnished with an electronic zoom function. Specifically, for ordinary image sensing (without electronic zooming), the vertical-direction Gray code counter 15f is so controlled as to start counting at "0," perform counting with one count skipped at a time, and stop counting at "30," and the horizontal-direction Gray code counter 15g is so controlled as to start counting at "0," perform counting with one count skipped at a time, and stop counting at "30." As a result, the solid-state image sensor 12 outputs image data of 256 pixels (16×16) from all over the image sensing area to the signal processing circuit 13. Thus, an image corresponding to the entire image sensing area of the solid-state image sensor 12 is displayed on the display device 14. By contrast, for image sensing using electronic zooming, the vertical-direction Gray code counter 15f is so controlled as to start counting at "0," perform counting consecutively, and stop counting at "15," and the horizontal-direction Gray code counter 15g is so controlled as to start counting at "0," perform counting consecutively, and stop counting at "15." As a result, the solid-state image sensor 12 outputs image data of 256 pixels (16×16) from the upper left-hand quarter of the image sensing area to the signal processing circuit 13. Thus, an image corresponding to the upper left-hand quarter of the image sensing area of the solid-state image sensor 12 is displayed on the display device 14. In this way, by performing electronic zooming in the camera system 10, it is possible to obtain a fourfold zoomed-in version of the upper left-hand quarter of the image obtained in ordinary image sensing.

Figure 21:
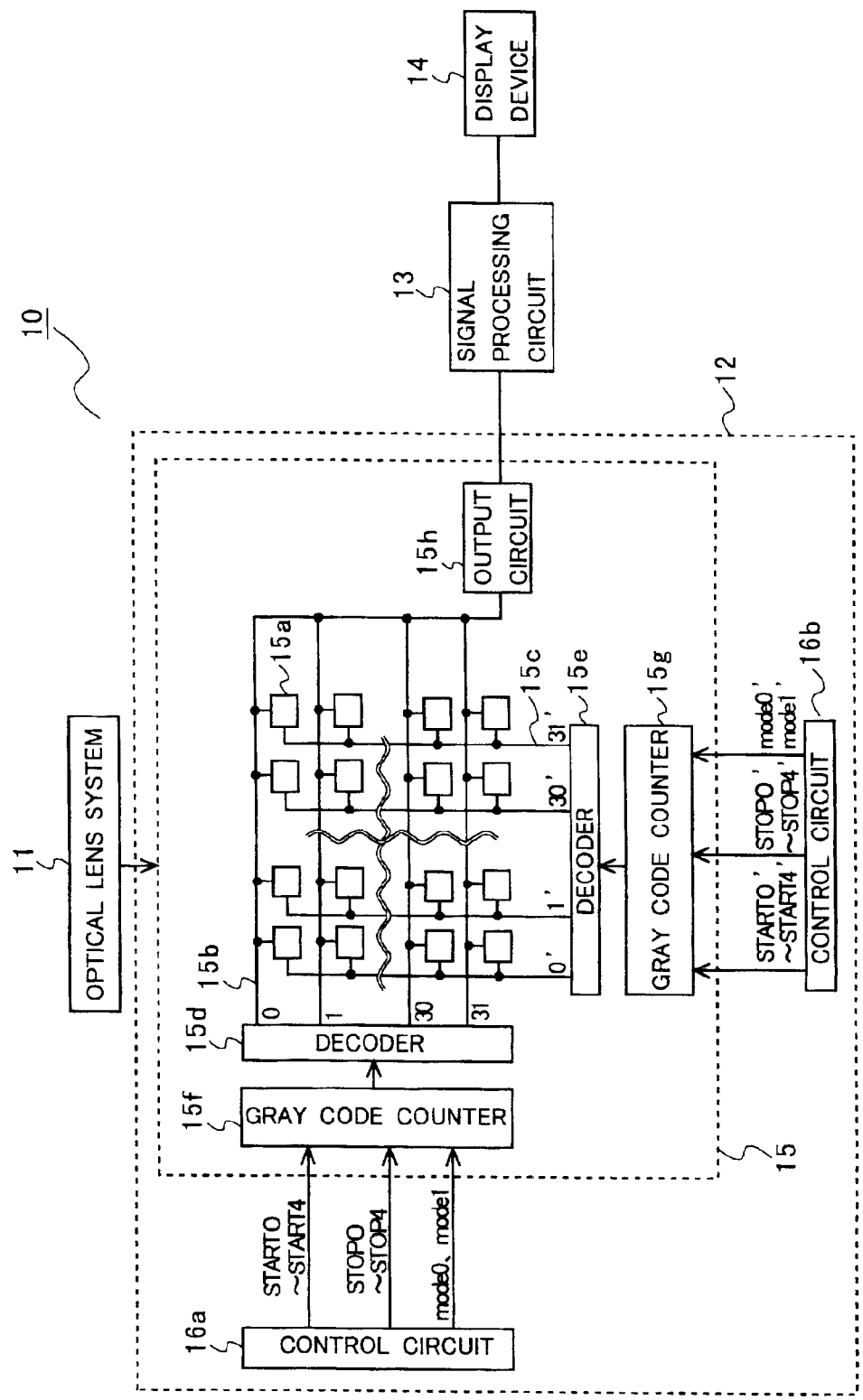
FIG. 21 is a diagram showing the configuration of a camera system according to the invention.

Moreover, the configuration shown in FIG. 21 permits the camera system 10 to be furnished with an image cutting function. Specifically, in ordinary shooting (without electronic zooming) as described above, when the lower left-hand quarter of the sensed image needs to be cut out, the vertical-direction Gray code counter 15f is so controlled as to start counting at "16," perform counting with one count skipped at a time, and stop counting at "30," and the horizontal-direction Gray code counter 15g is so controlled as to start counting at "0," perform counting with one count skipped at a time, and stop counting at "14." As a result, the solid-state image sensor 12 outputs image data of 64 pixels (8×8) from the lower left-hand quarter of the image sensing area to the signal processing circuit 13. Thus, an image corresponding to the lower left-hand quarter of the image sensing area of the solid-state image sensor 12 is displayed on the display device 14.

It is also possible to use, instead of the display device 14 having 256 pixels (16×16), a display device having 1,024 pixels (32×32) and take both still and moving pictures. In this configuration, when a still picture is taken, all the addresses are scanned, and, when a moving picture is taken, the addresses are scanned in an interlaced manner. This makes it possible, when a moving picture is taken, to perform scanning below the limit frequency and, when a still picture is taken, to obtain satisfactory resolution in the image displayed on the display device 14.

Furnished with an electronic zoom function, a camera system according to the invention permits a sufficiently wide zoom range to be secured in the camera system as a whole even with an optical lens system having a narrower zoom range. This helps miniaturize the camera system.

What is claimed is:

1. A Gray code counter comprising:
a consecutively counting Gray code counter that counts in increments or decrements of one; and
an output value converter circuit,
wherein the output value converter circuit converts Gray code data output from the consecutively counting Gray code counter into a Gray code corresponding to a decimal count as obtained by counting with (2 raised to a particular power minus 1, the particular power being an integer greater than 0) counts skipped at a time.

2. A Gray code counter as claimed in claim 1, wherein the consecutively counting Gray code counter is an N-bit counter, and when counting is performed with $2^M-1$ counts skipped at a time, the output value converter circuit operates in such a way as to output highest (N−M) bits
by using, as data of an (α+M)th bit, data of an αth bit belonging to lowest (N−M) bits of the Gray code data output from the consecutively counting Gray code counter, and output remaining lowest M bits
by inverting data of an (M−1)th bit every time a count changes, and
by keeping data of (M−2)th and lower bits, if any, constant at "0".

3. A Gray code counter as claimed in claim 1, further comprising an input value converter circuit and a count start data setting circuit, wherein, when counting is performed with a predetermined number of counts skipped at a time, the input value converter circuit converts, according to the number of counts skipped, Gray code data corresponding to a decimal count at which to start counting into a Gray code corresponding to a decimal count as obtained when counting is performed consecutively, and the count start data setting circuit controls an initial state of the consecutively counting Gray code counter according to the Gray code data output from the input value converter circuit.

4. A Gray code counter as claimed in claim 3, wherein the consecutively counting Gray code counter is an N-bit counter, and when counting is performed with $2^M-1$ counts skipped at a time, the output value converter circuit operates in such a way as to output highest (N−M) bits
by using, as data of an (α+M)th bit, data of an αth bit belonging to lowest (N−M) bits of the Gray code data output from the consecutively counting Gray code counter, and output remaining lowest M bits
by inverting data of an (M−1)th bit every time a count changes, and,
if an (M−2)th or any lower bit exists, by using, as data of a βth bit, data of a βth bit belonging to (M−2)th and lower bits of Gray code data output from the consecutively counting Gray code counter when counting is started.

5. A Gray code counter as claimed in claim 1, wherein the output value converter circuit comprises a selector circuit, and, according to an external signal, the selector circuit chooses whether
to output the Gray code data output from the consecutively counting Gray code counter intact or
to convert the Gray code data output from the consecutively counting Gray code counter into a Gray code corresponding to a decimal count as obtained by counting with (2 raised to a particular power minus 1) counts skipped at a time.

6. A Gray code counter as claimed in claim 2, wherein the output value converter circuit comprises a selector circuit, and, according to an external signal, the selector circuit chooses whether
to output the Gray code data output from the consecutively counting Gray code counter intact or
to convert the Gray code data output from the consecutively counting Gray code counter into a Gray code corresponding to a decimal count as obtained by counting with (2 raised to a particular power minus 1) counts skipped at a time.

7. A Gray code counter as claimed in claim 3, wherein the output value converter circuit comprises a selector circuit, and, according to an external signal, the selector circuit chooses whether
to output the Gray code data output from the consecutively counting Gray code counter intact or
to convert the Gray code data output from the consecutively counting Gray code counter into a Gray code corresponding to a decimal count as obtained by counting with (2 raised to a particular power minus 1) counts skipped at a time.

8. A Gray code counter as claimed in claim 4, wherein the output value converter circuit comprises a selector circuit, and, according to an external signal, the selector circuit chooses whether
to output the Gray code data output from the consecutively counting Gray code counter intact or
to convert the Gray code data output from the consecutively counting Gray code counter into a Gray code corresponding to a decimal count as obtained by counting with (2 raised to a particular power minus 1) counts skipped at a time.

9. A solid-state image sensor comprising:

a plurality of photoelectric conversion elements;

a scanning circuit having a Gray code counter for sequentially reading signals from the photoelectric conversion elements, wherein the Gray code counter is a Gray code counter as claimed in claim 5.

10. A solid-state image sensor as claimed in claim 9, wherein the consecutively counting Gray code counter is an N-bit counter, and when counting is performed with $2^M-1$ counts skipped at a time, the output value converter circuit operates in such a way as to output highest (N−M) bits
by using, as data of an (α+M)th bit, data of an αth bit belonging to lowest (N−M) bits of the Gray code data output from the consecutively counting Gray code counter, and output remaining lowest M bits
by inverting data of an (M−1)th bit every time a count changes, and
by keeping data of (M−2)th and lower bits, if any, constant at "0".

11. A solid-state image sensor as claimed in claim 9, wherein the Gray code counter further comprises an input value converter circuit and a count start data setting circuit, so that, when counting is performed with a predetermined number of counts skipped at a time, the input value converter circuit converts, according to the number of counts skipped, Gray code data corresponding to a decimal count at which to start counting into a Gray code corresponding to a decimal count as obtained when counting is performed consecutively, and the count start data setting circuit controls an initial state of the consecutively counting Gray code counter according to the Gray code data output from the input value converter circuit.

12. A solid-state image sensor as claimed in claim 11, wherein the consecutively counting Gray code counter is an N-bit counter, and when counting is performed with $2^M-1$ counts skipped at a time, the output value converter circuit operates in such a way as to output highest (N−M) bits by using, as data of an (α+M)th bit, data of an αth bit belonging to lowest (N−M) bits of the Gray code data output from the consecutively counting Gray code counter, and output remaining lowest M bits by inverting data of an (M−1)th bit every time a count changes, and, if an (M−2)th or any lower bit exists, by using, as data of a βth bit, data of a βth bit belonging to (M−2)th and lower bits of Gray code data output from the consecutively counting Gray code counter when counting is started.

13. A camera system comprising:

a solid-state image sensor;

an optical lens system for picking up an optical real image as a target of image sensing and imaging the optical real image on the solid-state image sensor;

an output circuit for producing a drive signal based on a signal output from the solid-state image sensor; and a display device for displaying an image by being driven by the drive signal, wherein the solid-state image sensor is a solid-state image sensor as claimed in claim 9.

14. A camera system as claimed in claim 13, wherein the consecutively counting Gray code counter is an N-bit counter, and when counting is performed with $2^M-1$ counts skipped at a time, the output value converter circuit operates in such a way as to output highest (N−M) bits by using, as data of an (α+M)th bit, data of an αth bit belonging to lowest (N−M) bits of the Gray code data output from the consecutively counting Gray code counter, and output remaining lowest M bits by inverting data of an (M−1)th bit every time a count changes, and by keeping data of (M−2)th and lower bits, if any, constant at "0".

15. A camera system as claimed in claim 13, wherein the Gray code counter further comprises an input value converter circuit and a count start data setting circuit, so that, when counting is performed with a predetermined number of counts skipped at a time, the input value converter circuit converts, according to the number of counts skipped, Gray code data corresponding to a decimal count at which to start counting into a Gray code corresponding to a decimal count as obtained when counting is performed consecutively, and the count start data setting circuit controls an initial state of the consecutively counting Gray code counter according to the Gray code data output from the input value converter circuit.

16. A camera system as claimed in claim 15, wherein the consecutively counting Gray code counter is an N-bit counter, and when counting is performed with $2^M-1$ counts skipped at a time, the output value converter circuit operates in such a way as to output highest (N−M) bits by using, as data of an (α+M)th bit, data of an αth bit belonging to lowest (N−M) bits of the Gray code data output from the consecutively counting Gray code counter, and output remaining lowest M bits by inverting data of an (M−1)th bit every time a count changes, and, if an (M−2)th or any lower bit exists, by using, as data of a βth bit, data of a βth bit belonging to (M−2)th and lower bits of Gray code data output from the consecutively counting Gray code counter when counting is started.

* * * * *